US005742120A

United States Patent [19]

Lin

[11] Patent Number: 5,742,120
[45] Date of Patent: Apr. 21, 1998

[54] LIGHT-EMMITING DIODE LAMP WITH DIRECTIONAL COVERAGE FOR THE EMMITTED LIGHT

[75] Inventor: Li-Yu Lin, Taipei, Taiwan

[73] Assignee: Rebif Corporation, Taipei, Taiwan

[21] Appl. No.: 644,274

[22] Filed: May 10, 1996

[51] Int. Cl.⁶ .................... H01L 23/13; H05B 33/02
[52] U.S. Cl. .................... 313/512; 313/499; 362/800
[58] Field of Search .................... 313/512, 499, 313/501, 113; 362/800

[56] References Cited

U.S. PATENT DOCUMENTS

| 3,676,668 | 7/1972 | Collins et al. | 313/512 X |
| 3,834,883 | 9/1974 | Klein | 313/512 X |
| 5,066,889 | 11/1991 | Edwards | 313/512 X |
| 5,289,082 | 2/1994 | Komoto | 313/512 X |

Primary Examiner—Ashok Patel
Attorney, Agent, or Firm—Bacon & Thomas

[57] ABSTRACT

An LED lamp allows the emitted LED light to be directed substantially in a desired direction. The LED lamp comprises an LED and a transparent housing for accommodating the LED. The transparent housing has a substantially semi-convex top formed with at least a total reflection plane. When the LED is placed at a specific position, part of the emitted LED light that strikes on the total reflection plane will be totally reflected from the total reflection plane. As a result, if the LED lamp is placed horizontally, as for example when mounted on an upright installed commercial sign, the emitted LED light rays will be virtually all directed at descending angles that allow people passing by the commercial sign to see the sign more clearly.

3 Claims, 5 Drawing Sheets

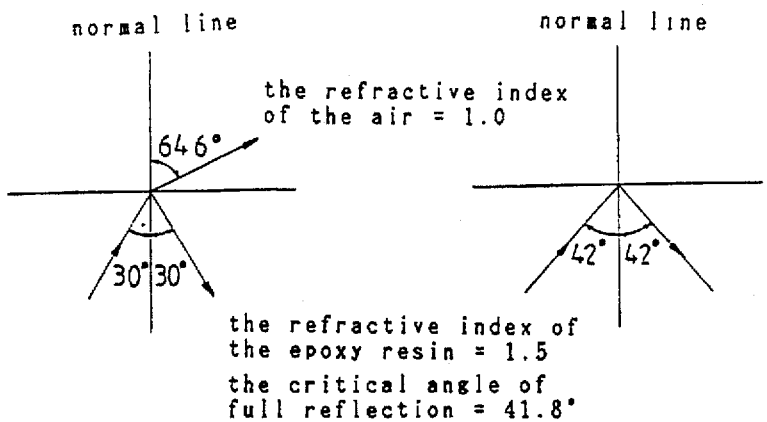
FIG.3A                    FIG.3B
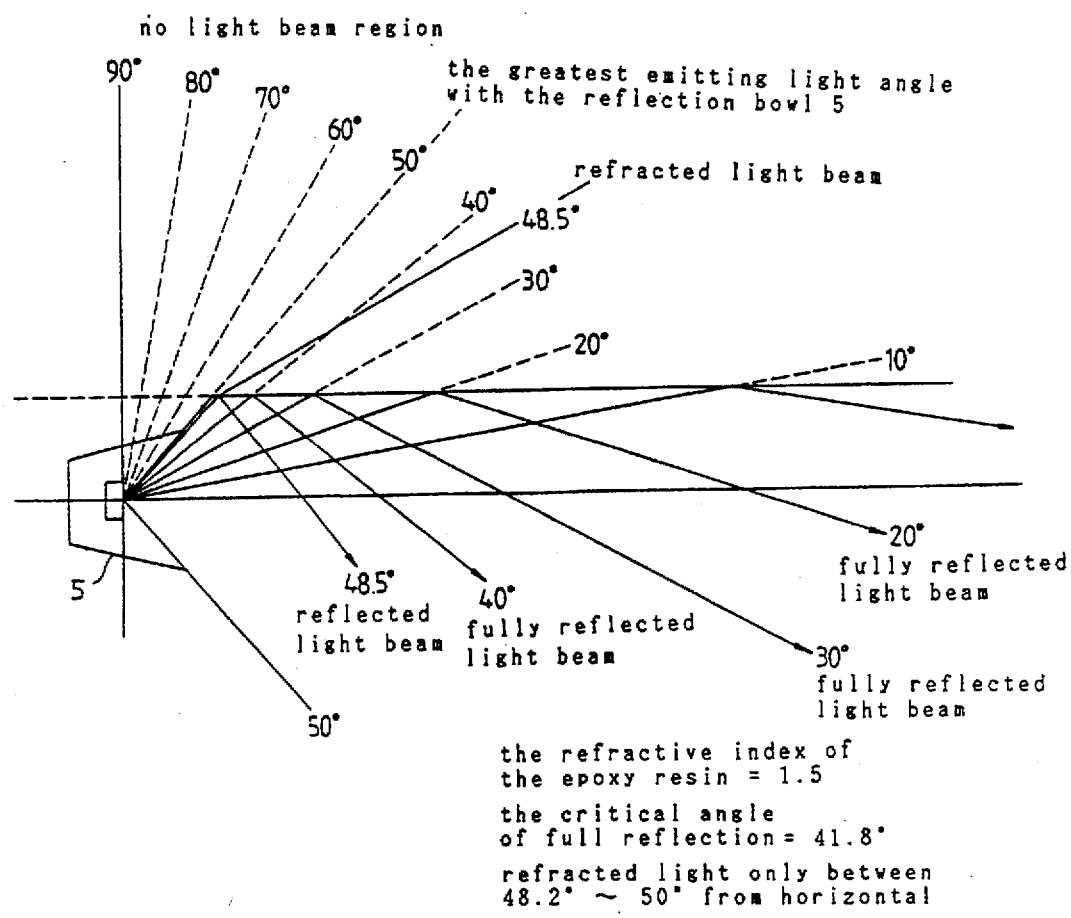
FIG.4

LIGHT-EMMITING DIODE LAMP WITH DIRECTIONAL COVERAGE FOR THE EMMITTED LIGHT

BACKGROUND OF THE INVENTION

1. Field of the Invention

The present invention relates to light-emitting diode (LED) lamps, and more particularly, to an LED lamp having improved optical structure that allows the emitted LED light to be directed in substantially a desired direction.

2. Description of Related Art

A light-emitting diode (LED) lamp is a display device consisting of a light-emitting diode, a reflector, and plastic lens that focuses the emitted LED light into a conical beam. The LED lamp is usually utilized on commercial signs or meters to display certain messages or readings. Moreover, the LED lamp finds uses in light-weight, small-sized computer displays and TV screens that can display digital graphics and videos.

A conventional LED lamp is hereinunder described with reference to FIGS. 1A through 1C. Referring to FIG. 1A, the conventional LED lamp is composed of a PN junction diode 1 made of GaP or GaAs (which is the so-called light-emitting diode, LED), a pair of leads 2, 3 for connecting the PN junction diode to a power supply (not shown), and a transparent housing 4 made of epoxy resin and having a convex top. Referring further to FIG. 1B, in order to focus the emitted LED light in one direction and also to increase the intensity of the emitted light, a concave reflector 5 is provided beneath the PN junction diode 1 so as to reflect the light transmitted thereto in the reverse direction. Referring further to FIG. 1C, in this schematic diagram, the point indicated by the numeral 6 shows the center of curvature of the convex top of the transparent housing 4. The distance L between the position of the PN junction diode 1 and the from plane of the convex top of the transparent housing 4 is referred to as the LED object length.

When the PN junction diode 1 is placed at the point 6 (which is the center of curvature of the convex top of the transparent housing 4), the emitted light from the convex top of the transparent housing 4 is a parallel beam, whereas when it is placed at a position 7 backward from the point 6, the emitted light from the convex top of the transparent housing 4 is a converged beam with higher intensity. However, with the emitted LED light more converged, the coverage thereof is reduced that would cause the, emitted LED light hardly viewable by a person standing at an angle away from the optical axis of the convex top of the transparent housing 4. The greater the LED object length, the narrower is the coverage.

Commercial signs are usually placed at a high altitude on a post or building so as to attract wide attentions. Thus, the LED lamps on a commercial sign placed at a high altitude should have their emitted LED light directed at descending angles so as to allow pedestrians on the streets or any passer-by to see the emitted LED light. However, since most commercial signs are manufactured with the foregoing conventional LED lamps which emit light only in the direction defined by the optical axis of the convex top of the transparent housing 4, an upright installed commercial sign would emit light substantially only in the horizontal direction, thus letting people not able to see the light emitted therefrom. Titling the commercial sign would usually not an acceptable solution since a tilted commercial sign is difficult to be firmly supported and also provides an unpleasant looking.

A solution to the foregoing problem is to bend the leads 2, 3 of the LED 1 so as to allow the emitted LED light to transmit in the desired direction. However, since a commercial sign is usually provided with an array of LED lamps, this solution can hardly provide precise and consistent alignment of all the LED lamps in the desired direction. Moreover, the work involved in the bending of the LED leads is quite laborious, which would significantly increase the manufacture cost.

Another solution is to increase the coverage of the emitted LED light by shifting the LED toward the center of curvature of the convex top of the transparent housing 4. However, this solution would cause a reduction in intensity and also cause part of the emitted LED light to be transmitted to no-man's space, thus causing an inefficient operation and waste in electrical power that drives the LED lamp.

SUMMARY OF THE INVENTION

It is therefore a primary objective of the present invention to provide an LED lamp which allows the emitted LED light to be directed substantially in a desired direction, specifically at descending angles when the LED lamp is used on an upright installed commercial sign.

It is another objective of the present invention to provide an LED lamp which allows the emitted light to be focused in a desired direction with increased intensity.

It is still another objective of the present invention to provide an LED lamp which is easy to assembly with low manufacture cost.

In accordance with the foregoing and other objectives of the present invention, a new and improved LED lamp is provided. The LED lamp comprises an LED and a transparent housing for accommodating the LED. It is a characteristic part of the present invention that the transparent housing has a substantially semi-convex top formed with at least a total reflection plane which is the interface between the transparent housing for the LED and the ambient atmospheric air.

When the LED is placed at a specific position, part of the emitted LED light that strikes on the total reflection plane will be totally reflected from the total reflection plane. As a result, if the LED lamp is placed horizontally, as for example when mounted on an upright installed commercial sign, the emitted LED light will be virtually directed at descending angles that allow people passing by the commercial sign to see the sign more clearly.

BRIEF DESCRIPTION OF DRAWINGS

The present invention can be more fully understood by reading the subsequent detailed description of the preferred embodiments thereof with references made to the accompanying drawings, wherein:

FIG. 3A is a schematic diagram used to depict the refraction and reflection of emitted LED light when incident angle is less than the critical angle of total reflection;

FIG. 3B is a schematic diagram used to depict the total reflection effect of emitted LED light when incident angle is greater than the critical angle of total reflection;

FIG. 4 is a schematic diagram used to depict the total reflection effect in the LED lamp according to the present invention;

DETAILED DESCRIPTION OF PREFERRED

Figure 1A:
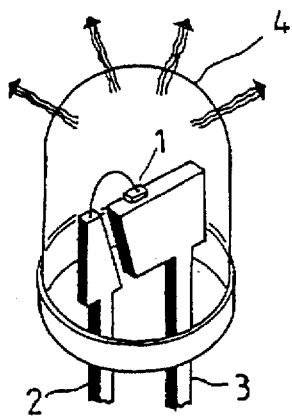
FIG. 1A shows a perspective view of a conventional LED lamp.
Figure 1B:
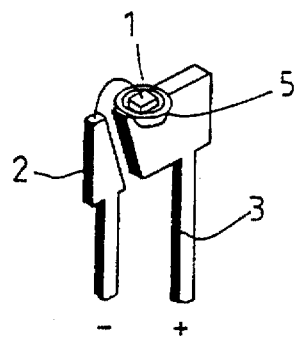
FIG. 1B shows a perspective view of the core component of the conventional LED lamp of FIG. 1A.
Figure 1C:
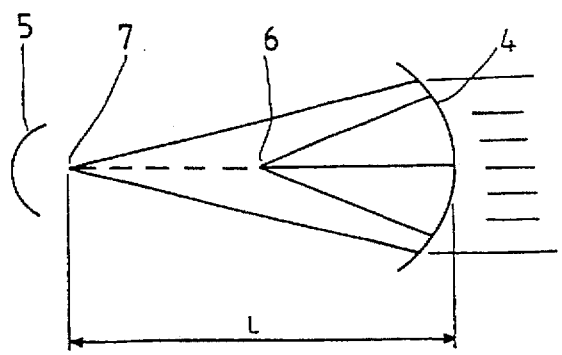
FIG. 1C is a schematic diagram depicting the optical structure used in the conventional LED lamp for focusing the emitted LED light in one direction.

In accordance with the present invention, the transparent housing for the LED lamp is also formed with the same convex top as the transparent housing 4 shown in FIGS. 1A and 1C used in the conventional LED lamp except that the convex top of the transparent housing used in the present invention is removed with a cutaway portion that provides a total reflection effect to the emitted LED light so as to allow the emitted LED light to transmit in a desired direction (or specifically at descending angles when the LED lamp is oriented with the optical axis of the convex top of the transparent housing in the horizontal plane).

Figure 2A:
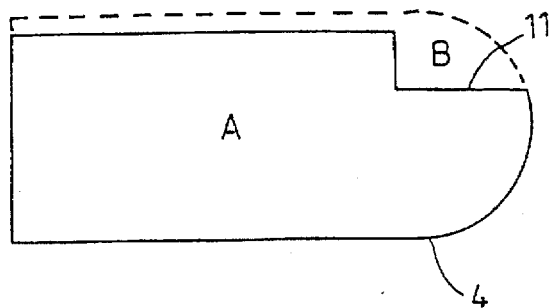
FIG. 2A shows a side view of a transparent housing employed in an LED lamp according to the present invention.

Referring to FIG. 2A, there is shown the structure of the transparent housing 4 employed by the present invention to house a PN junction diode (not shown). The transparent housing 4 disclosed here is removed with a cutaway portion B in such a way that the remaining portion A is formed with a plane 11 (which is hereinafter referred to as the total reflection plane) that will allow a total reflection effect to the emitted LED light. The partly removed top of the transparent housing 4 is hereinafter referred to as a "semi-convex top".

Figure 2B:
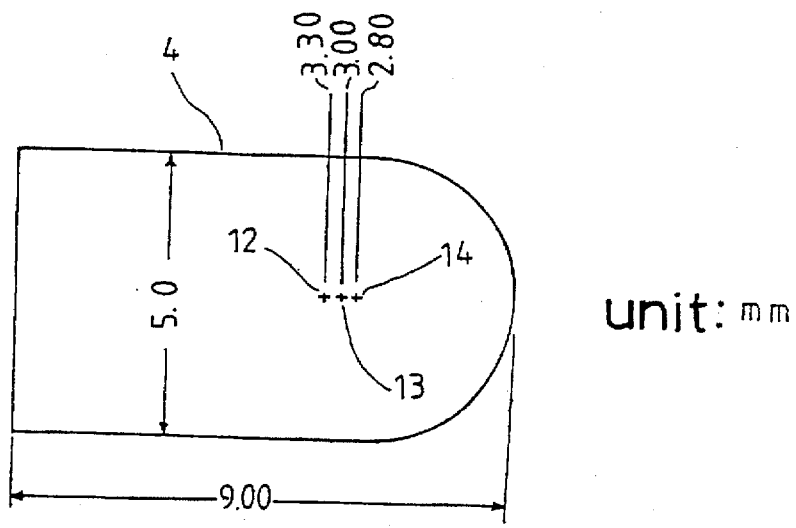
FIG. 2B is a schematic diagram used to depict the positioning of the LED in the LED lamp of FIG. 2A.
Figure 2C:
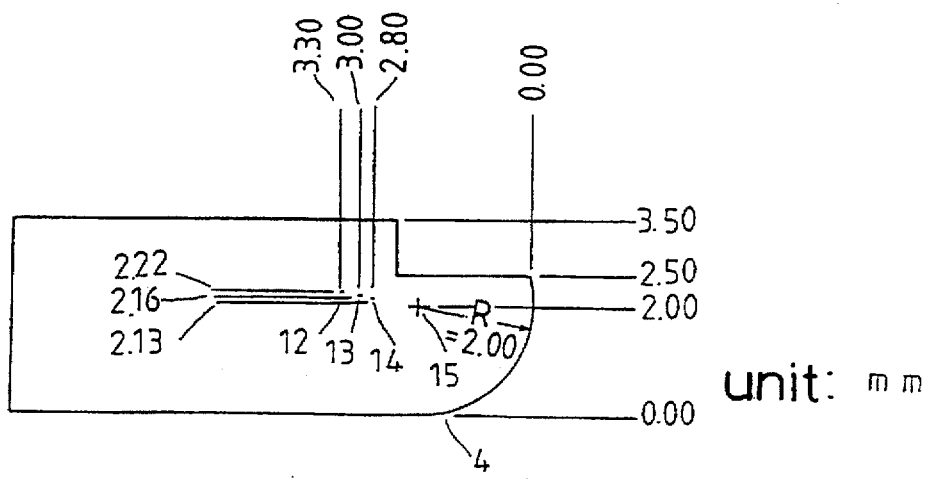
FIG. 2C is a schematic diagram used to depict the positioning of the LED in the LED lamp of FIG. 2A.

FIG. 2B shows also a side view of the transparent housing 4 but viewing from a different angle. The three points respective indicated by the numerals 12, 13, 14 are three positions on which the LED can be selectively placed. Referring further to FIG. 2C, the point indicated by the numeral 15 shows the center of curvature of the semi-convex top of the transparent housing 4. In a practical example, the size of the transparent housing 4 is 9.00 mm in length and 5.00 mm in diameter with the semi-convex top having a radius of curvature R=2.00 mm; the distances from the points 12, 13, 14 to the front plane of the semi-convex top of the transparent housing 4 are respectively 3.30 mm, 3.00 mm, and 2.80 mm which are each greater than the radius of curvature of the semi-convex top of the transparent housing 4, and the distances from the points 12, 13, 14 to a side tangential plane to the transparent housing 4 as indicated by 0.00 are respectively 2.22 mm, 2.16 mm, and 2.13 mm. The positions of these points 12, 13, 14 are predetermined that allow easy change of the LED from one position to another.

By basic optics principles, a light beam traveling from a first medium to a second medium having a smaller refractive index will be totally reflected at the interface when the incident angle is greater than a specific angle called total reflection angle. In accordance with the present invention, the LED in the LED lamp is placed at a specific position that would allow a majority part of the emitted LED light to be totally reflected by the plane 11 to the desired direction. Derived from Snell's law, which is a well-know and basic knowledge to those skilled in the art of optics, the critical angle $\theta_{ic}$ for total reflection of a light beam traveling from a first medium having a refractive index $n_1$ to a second medium having a refractive index $n_2$, where $n_2 < n_1$, is:

$$\theta_{ic} = \sin^{-1}(n_2/n_1)$$

The transparent housing 4 is typically made of epoxy resin having a refractive index of about 1.5. Therefore, by the total reflection principle the critical angle of total reflection at an interface between the transparent housing 4 and the ambient atmospheric air (refractive index=1.0) is:

$$\theta_{ic} = \sin^{-1}(1.0/1.5) = 41.8°$$

Thus, for a light beam striking on the interface between the transparent epoxy resin housing 4 and the ambient atmospheric air (i.e., the foregoing defined total reflection plane 11), if the incident angle is less than 41.8°, for example 30.0° as illustrated in FIG. 3A, the incident light will be partly reflected and partly transmitted with a refractive angle of 64.6°; and if equal to or greater than 41.8°, for example 42.0° as illustrated in FIG. 3B, the incident light will be totally reflected.

As shown in FIG. 4, the concave reflector 5 provided to the left of the LED allows part of the emitted light transmitted thereto to be reflected back with a specific angle of coverage, for example 50°, relative to the optical axis OA of the semi-convex top of the transparent housing 4. Consequently, the region beyond the 50° angle (i.e., the angle range from 50° to 90°) is a no-light region. As derived earlier, since the critical angle of total reflection in this preferred embodiment is 41.8° which corresponds to an angle of 48.2° relative to the horizontal optical axis OA, the light rays transmitting within the angle range from 48.2° to 50° will be partly transmitted from the epoxy resin transparent housing 4 into the ambient atmospheric air and partly reflected, and the light rays transmitting within the angle range from above 0° to 48.2° will be totally reflected, as illustrated in FIG. 4.

In other variations, if the transparent housing 4 is made of an epoxy resin having an refractive index of 2.0, the critical angle of total reflection will be:

$$\theta_{ic} = \sin^{-1}(1.0/2.0) = 30.0°$$

which corresponds to an angle of 60.0° relative to the horizontal optical axis OA and which is greater than the maximum angle of coverage of 50° for the reflected light from the concave reflector 5. As a result, all the light rays reflected from the concave reflector 5 can be totally reflected from the total reflection plane 11.

Figure 5:
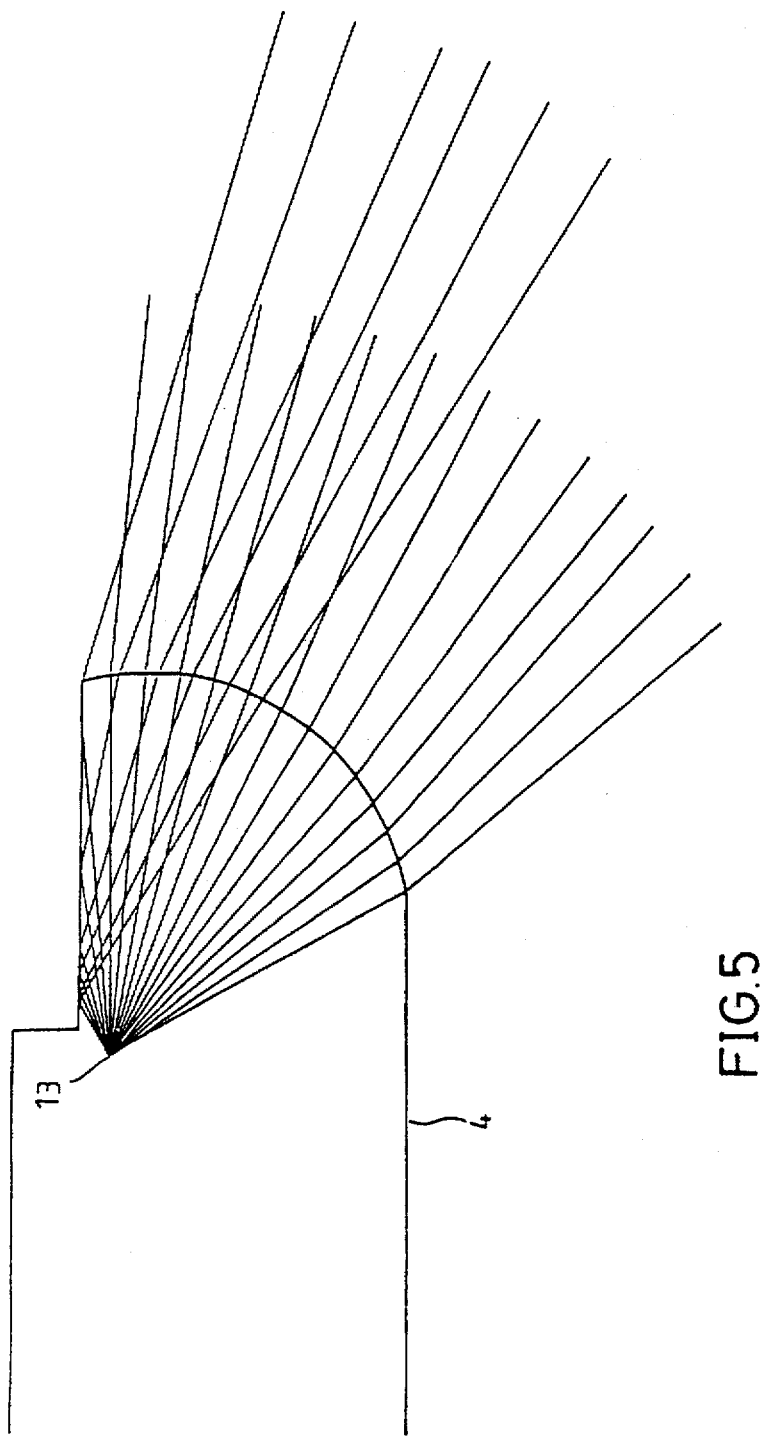
FIG. 5 is a schematic diagram used to depict the light rays that have been totally reflected in the LED lamp according to the present invention.

FIG. 5 shows the distribution of the emitted light rays from the LED lamp according to the present invention, which shows the fact that all of the LED light rays are virtually directed at descending angles relative to the horizontal optical axis OA. Thus, an up-right installed commercial sign which is provided with an array of LED lamps according to the present invention would provide a wide descending coverage for the emitted LED light that would allow people passing by the commercial sign, whether at a near or a far distance away, to be able to see the LED light emitted therefrom clearly.

Figure 6:
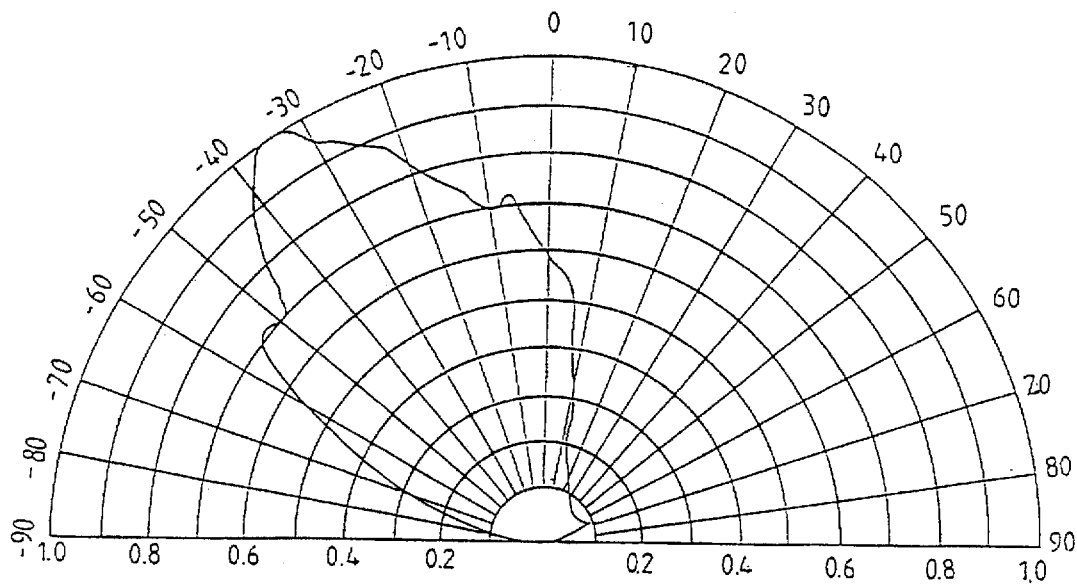
FIG. 6 is a graph, showing the intensity distribution of the emitted LED light with respect to descending angles.

FIG. 6 is a graph showing the intensity distribution of the LED light with respect to the descending angles. In this graph, positive angle values (0 to 90) represents ascending angles and negative angle values (−90 to 0) represents descending angles. It can be seen from the graph that the LED light covers a wide range of angles from slightly above 0° to about −60° with the maximum intensity at an angle of about −35°. To change the range of the coverage, the manufacturer needs just to change the position of the LED. Referring back to FIG. 4, repositioning the LED to the left will allow the range of the coverage to be shifted towards the horizontal optical axis OA, meaning that a person standing at a farther distance will see the LED more clearly; whereas repositioning the LED to the right will allow the range of the coverage to be shifted away from the horizontal optical axis OA, meaning that a person standing at a nearer distance will see the LED more clearly. The three positions 12, 13, 14 as shown in FIG. 2C are predetermined positions that allow the manufacturer to change the position of the LED quickly and easily based on customer-ordered specifications. Moreover, changing the refractive index of the transparent housing 4 will also cause a shift in the range of the coverage.

Figure 7A:
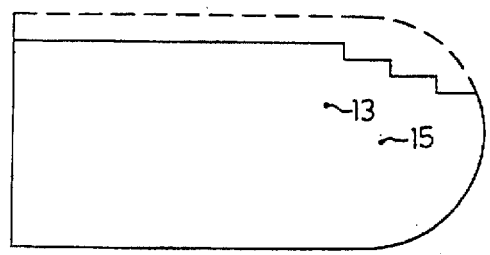
FIG. 7A is a schematic diagram showing the second preferred embodiment of the LED lamp according to the present invention.
Figure 7B:
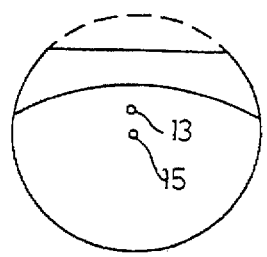
FIG. 7B is a schematic diagram showing the third preferred embodiment of the LED lamp according to the present invention.

In other embodiments, the semi-convex top of the transparent housing 4 can be formed in such a way as to provide a stair-like total reflection plane 11' as illustrated in FIG. 7A or a curved total reflection plane 11" which is bent about the optical axis OA of the LED lamp as illustrated in FIG. 7B for concentrating the emitted LED light as desired.

Moreover, it is an additional benefit of the present invention that, since the emitted light is directed substantially in one direction, the intensity is also increased that allows better viewing effect to the commercial sign and also allows the saving of electrical power. The bending of the leads of the LED in the conventional LED lamp is not required here by using the present invention. The LED lamp according to the present invention thus can be assembled without having to bend the LED leads, which significantly simplify the assemble work and saves manufacture cost.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. An LED lamp, comprising:

(a) an LED; and (b) a transparent housing for accommodating said LED, said transparent housing being formed with a substantially semi-convex top formed with at least a total reflection plane;
   wherein said LED is placed at a specific position which allows part of the emitted light of said LED to be totally reflected from said total reflection plane, and wherein said substantially semi-convex top is formed with a plurality of stair-like total reflection planes.

2. An LED as claimed in claim 1, wherein said LED is placed at a position beyond the radius of curvature of the semi-convex top of said transparent housing.

3. An LED as claimed in claim 1, wherein the total reflection plane is curved about the optical axis of the LED lamp.

* * * * *